United States Patent

[11] 3,629,017

[72] Inventor Fritz Stork
Grobgartach, Germany
[21] Appl. No. 862,776
[22] Filed Oct. 1, 1969
[45] Patented Dec. 21, 1971
[73] Assignee Telefunken Patentverwertungsgesellschaft m.b.H.
Ulm am Danube, Germany
[32] Priority Oct. 1, 1968
[33] Germany
[31] P 18 00 212.5

[54] METHOD OF PRODUCING A SEMICONDUCTOR DEVICE
10 Claims, 4 Drawing Figs.

[52] U.S. Cl. .......... 148/179, 148/180, 148/185
[51] Int. Cl. .......... H01l 7/46
[50] Field of Search .......... 148/177, 178, 179, 180, 185, 1.5

[56] References Cited

UNITED STATES PATENTS 3,537,920 11/1970 Carpentier .......... 148/179

*Primary Examiner*—Richard O. Dean
*Attorney*—Spencer & Kaye

ABSTRACT: A method of producing a semiconductor device, in which a region of a first conductivity type contains a plurality of regions of a second conductivity type, includes, after formation of the first conductivity type region, masking the semiconductor body to provide a plurality of uncovered areas and alloying into these areas a part of a foil placed on the semiconductor body by means of a specially controlled electron beam and leaving the nonalloyed part of the foil to provide electrical connection between the areas.

Inventor:
Fritz Stork

BY Spencer & Kaye
ATTORNEYS.

*Inventor:*
Fritz Stork
BY Spencer & Kaye
ATTORNEYS.

METHOD OF PRODUCING A SEMICONDUCTOR DEVICE

BACKGROUND OF THE INVENTION

Semiconductor components are already known wherein the injection current is distributed between a plurality of emission regions which are separate from one another, and is injected into a further common region from these emission regions through PN-junctions. For power transistors in particular, so-called overlay or multiemitter structures are frequently selected today. These transistors are of planar construction, wherein a base region extending to one surface of the semiconductor body is diffused into a semiconductor body of the type of conductivity of the collector region. After appropriate masking of the surface of the base region, a plurality of separate emitter regions are diffused into this base region and then all have to be provided with contacts. Finally, all emitter contacts are connected to one another through conducting paths extending over an insulating layer and to a joint emitter connection for the transistor. The contacts are generally produced by a metal layer being vapor deposited on the entire surface of the semiconductor body and then being structured in an appropriate manner for production, by means of the known photomasking and etching technique.

Planar structures are likewise known already, generally in germanium planar transistors, wherein an emitter region is alloyed into an indiffused base region.

SUMMARY OF THE INVENTION

It is an object of the invention to provide a method of producing a semiconductor device having a first region of one type of conductivity into which a plurality of regions of the other type of conductivity are alloyed.

According to the invention, there is provided a method of producing a semiconductor device having a region of a first type of conductivity in which a plurality of regions of a second type of conductivity are alloyed comprising the steps of producing in a semiconductor body a region of said first type of conductivity extending as far as the surface of said semiconductor body, masking said surface so as to define a plurality of uncovered areas, placing on said surface a coil of a material to be alloyed locally into said region of said first type of conductivity, and guiding an electron beam over said foil so as to heat said foil over said uncovered areas to alloy said foil into said region of said first type of conductivity so as to produce a plurality of regions of said second type of conductivity in said region of said first type of conductivity-forming barrier layers and leaving said foil which is not alloyed to said uncovered areas to provide an electrical connection between said uncovered areas.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Figure 1:
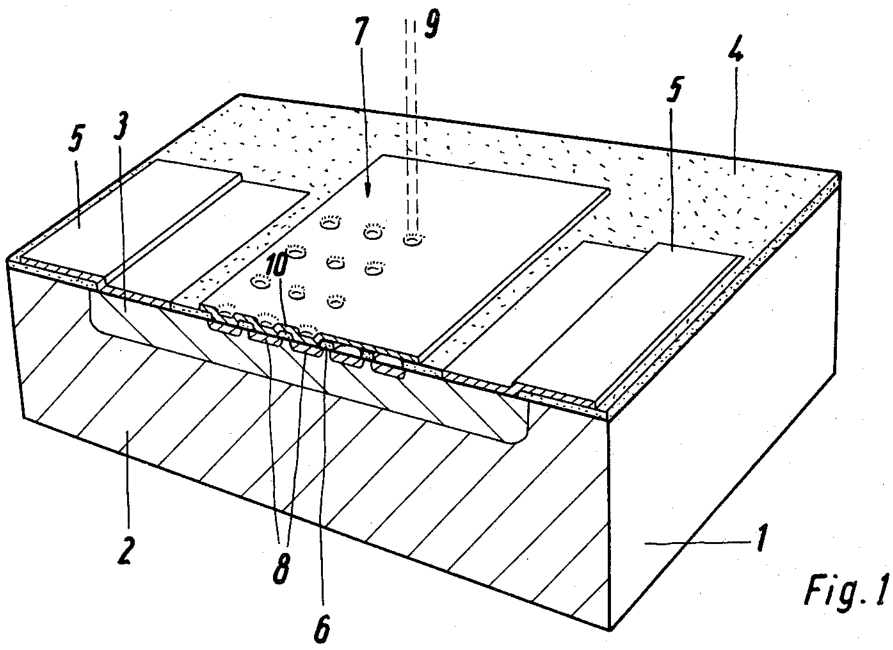
FIG. 1 shows a stage in the production of a transistor by one method in accordance with the invention.

Basically the invention provides a method of producing a semiconductor device having a region of a first type of conductivity in which a plurality of regions of a second type of conductivity are alloyed in which, after the production of the region of the first type of conductivity extending to one surface of a semiconductor body, this surface of the semiconductor body is masked with a layer of insulating material which leaves certain areas uncovered, a foil of the material to be alloyed locally into the semiconductor body is laid on the surface, an electron beam in guided and controlled over the foil so that the foil is heated at the areas uncovered by the insulating layer and is alloyed into the region of the one type of conductivity, forming barrier layers, and the part of the foil which is not alloyed into the region of the first type of conductivity is left on the surface of the semiconductor body as an electrical connection between the individual areas alloyed in.

The method according to the invention is particularly suitable for the production of power planar transistors with numerous individual emitters which are alloyed into a base region bordering on all the emitters jointly. The method indicated has the advantage that the emitter regions are produced and have contact made to them simultaneously. In this manner, apart from the vapor deposition process for the emitter contact material, the masking and etching of this vapor-deposited layer of contact-making material, which was hitherto necessary, is also superfluous. In order to produce such power transistors with a multiple-emitter structure, the first region of the one type of conductivity is let or diffused, as a base region, into a semiconductor body of the type of conductivity of the collector region, while a plurality of emitter regions which are connected to one another are alloyed into this base region by means of a controlled electron beam.

It has been found that electron beams are particularly suitable for alloying sharply localized areas of a layer of alloying material into a semiconductor body. The intensity and cross section of an electron beam can easily be varied. In an advantageous further development of the method according to the invention, therefore, it is provided that the cross section, the intensity, the interval rhythm at which the electron beam is interrupted, and the displacement of the electron beam over the foil to be alloyed locally into the semiconductor body should be controlled by means of a preprogrammed computer.

In a further advantageous embodiment of the method according to the invention, a base window is first introduced into an insulating layer covering a semiconductor body of the type of conductivity of the collector region, then an impurity containing the base diffusion material is vapor deposited over the entire surface of the semiconductor body containing the base window. In a subsequent heat treatment, impurities are diffused out of the vapor-deposited layer into the semiconductor body and produce the type of conductivity of the base region in an area of the semiconductor body. Then the vapor-deposited layer is removed again. Recesses, which do not extend as far as the collector-to-base PN-junction, are then introduced into the base region by means of an electron beam. During the subsequent masking of the semiconductor surface with an insulating layer, the recesses remain uncovered. The foil of emitter-alloying material is now laid over the surface of the semiconductor and parts of the superimposed foil are alloyed into said recesses by means of an electron beam, forming the base-to-emitter barrier layers. Here again, the unalloyed portions of the foil serve for the mutual electrical interconnection of the individual emitter regions. As a result of the production of recesses in the base region, into which the emitter regions are alloyed, before the emitter-alloying process, very narrow base widths are obtained and hence very high cutoff frequencies and high current gains.

Silicon oxide, silicon dioxide or silicon nitride is particularly suitable as a material for the insulating layer.

Referring now to FIG. 1 of the drawings, there is shown a semiconductor body 1 with a region 2 of the type of conductivity of the collector region. In order to produce the base region 3, the semiconductor body 1 is covered with an insulating layer 4 in which a base diffusion window is introduced by means of the known photolacquer masking and etching technique. Two impurities, which redope part of the collector region to form the base region 3, are indiffused through this window. Then the insulating layer 4, which consists for example of silicon oxide, silicon dioxide or silicon nitride, is again completed, and apertures are introduced into the insulating layer as emitter-alloying windows by a further masking and etching process at the areas provided for the production of different emitter regions. One or more further apertures serve as base contact-making windows. A foil 7 of the emitter-alloying material is now laid over the insulating layer 4. A registering process is necessary for this, which corresponds to the known mutual registering of masks of semiconductor wafers. The foil is held in this registered position. An electron beam 9 is now guided over the foil 7 and is so controlled that, at points on the surface where the insulating layer 4 has apertures, the alloying material is heated to the alloying temperature and alloyed into the base region 3, forming the emitter regions 8. At points of the surface at which the insulating layer covers the semiconductor surface and the alloying material is not caused to melt, parts 10 of the foil bridge the areas 6 of insulating material between the individual emitters and so represent the electrical connection between the emitter regions which are separated from one another. Finally, the base contacts 5 can be produced by vapor deposition using a metal mask. It is also possible, to produce the base contacts in the insulating layer before the emitter-alloying windows are formed and to produce the emitter regions by means of the known vapor deposition, photomasking and etching technique.

If it is desired to produce PNP-germanium planar transistors with a multiple-emitter structure by the method according to the invention, an aluminum foil is preferably selected as alloying material. In the manufacture of PNP-silicon planar transistors with multiple-emitter structure, the foil to be alloyed in locally consists of a gold-boron alloy, whereas with NPN-silicon planar transistors, a foil of a gold-arsenic alloy is used to produce the emitter structure. The foils preferably have a thickness of between 25 and 50 $\mu m$.

Figure 2:
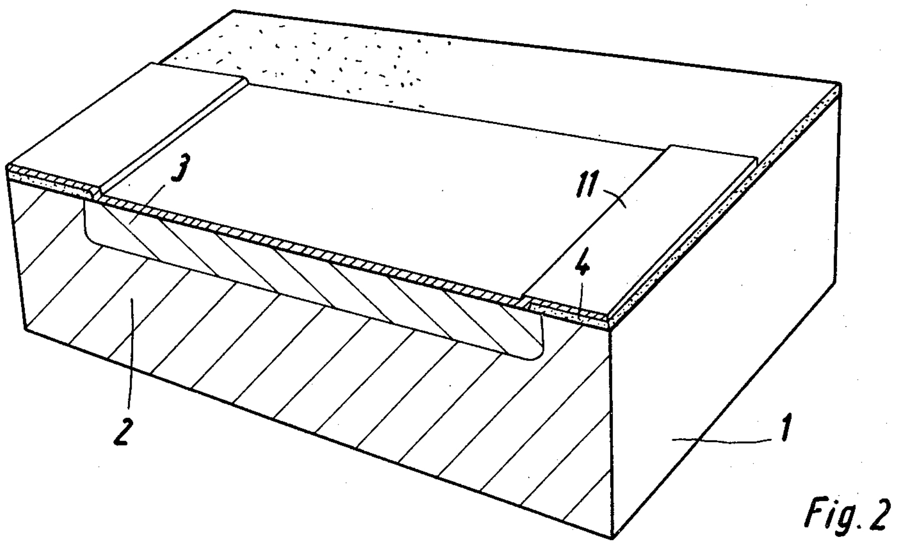
FIG. 2 shows a first stage in the production of a transistor by a second method in accordance with the invention.
Figure 3:
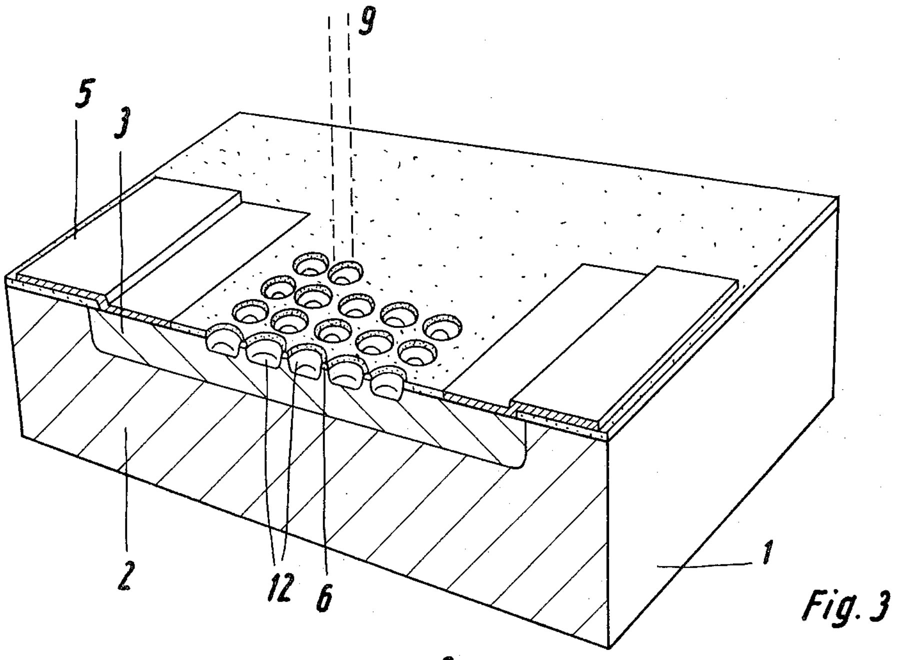
FIG. 3 shows a second stage of the second method.

A somewhat modified procedure will be described in more detail with reference to FIGS. 2 to 4. In FIG. 2, a semiconductor body 1 with a region 2 of the type of conductivity of the collector region of a transistor to be manufactured is again illustrated. A base diffusion window is introduced into the insulating layer 4 on the semiconductor surface and a layer 11 of the diffusion material for the base region is vapor deposited and initially alloyed into this base diffusion window. If a PNP-planar transistor is to be produced, this vapor-deposition layer 11 may consist of arsenic or antimony. During a following heat treatment, impurities which redope an area 3 of the semiconductor body to form the base region, diffuse out of the vapor-deposited layer 11 into the semiconductor body 1. Then the layer 11 of the base diffusion material is again removed from the semiconductor surface in a suitable solvent and the insulating layer 4 is completed. According to FIG. 3, holes are introduced into the insulating layer 4 which consists of silicon dioxide for example, by means of a controlled electron beam 9. In the course of this, surface areas of the base region are also removed so that recesses 12 are formed in the base region but do not extend as far as the base-to-collector PN-junction Webs of semiconductor material of the type of conductivity of the base region remain between the individual recesses and are covered by webs 6 of oxide layer. Base contacts 5 are vapor deposited in the base contact-making windows likewise introduced into the oxide layer 4, for example by means of a metal mask.

Figure 4:
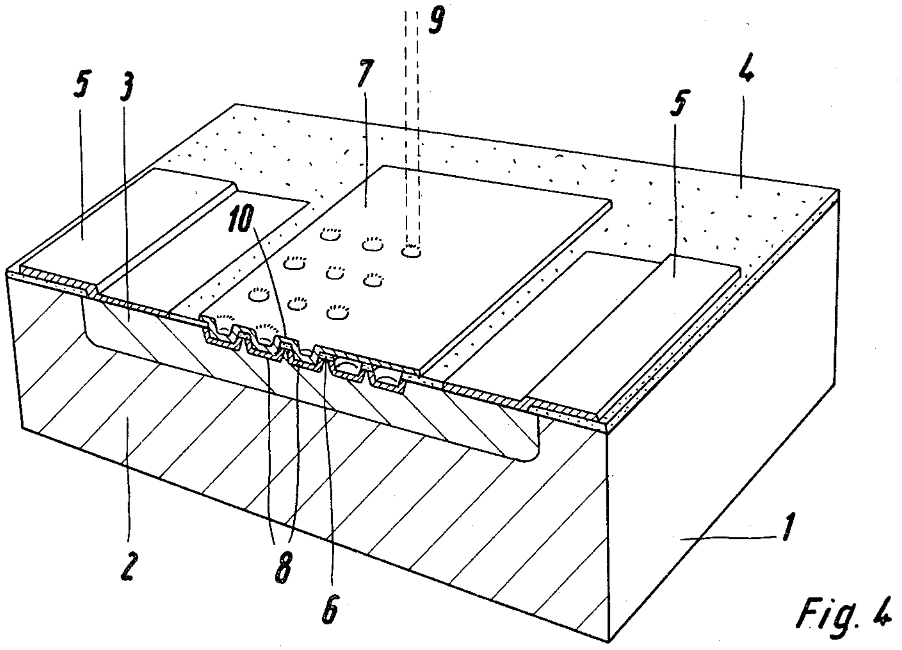
FIG. 4 shows a third stage of the second method.

Finally, as can be seen from FIG. 4, a foil 7 of an emitter-alloying material is laid on the oxide layer and covers the apertures in the oxide layer and the recesses 12 in the base region. An electron beam 9 is guided over the foil and controlled in such a manner that the foil 7 is heated to the alloying temperature in the areas where it covers the recesses in the base region so that, at these the alloying material is alloyed into the base region, forming the emitter regions 8 which are separated from one another. The remaining portions 10 of the foil bridge the webs 6 of insulating material between the individual emitter regions and represent the electrical connection to all the individual emitters.

The selection of the alloying materials, the semiconductor material and the impurity concentration in the individual semiconductor areas may be adapted to requirements and varied in any desired manner. What is important in the present invention is that a plurality of regions are alloyed in a semiconductor body from a foil by means of an electron beam and the nonalloyed portions of the foil are used at the same time as electrical leads to these regions.

It will be understood that the above description of the present invention is susceptible to various modifications changes and adaptations.

What I claim as new and desire to secure by letters Patent of the United States is:

1. A method of producing a semiconductor device having a region of a first type of conductivity in which a plurality of regions of a second type of conductivity are alloyed, comprising the steps of producing in a semiconductor body a region of said first type of conductivity extending as far as the surface of said semiconductor body, masking said surface so as to define a plurality of uncovered areas, placing on said surface a foil of a material to be alloyed locally into said region of said first type of conductivity, and guiding an electron beam over said foil so as to heat said foil over said uncovered areas to alloy said foil into said region of said first type of conductivity so as to produce a plurality of regions of said second type of conductivity in said region of said first type of conductivity-forming barrier layers and leaving said foil which is not alloyed to said uncovered areas to provide an electrical connection between said uncovered areas.

2. A method as defined in claim 1, wherein said region of said first type of conductivity is a base region let into a semiconductor body of the type of conductivity of a collector region, and said plurality of regions of said second type of conductivity form a plurality of emitter regions.

3. A method as defined in claim 2, further comprising using as said foil an aluminum foil in the production of emitter regions for PNP-germanium planar transistors.

4. A method as defined in claim 2, further comprising using as said foil a gold-boron foil in the production of emitter regions for PNP-silicon planar transistors.

5. A method as defined in claim 2, further comprising using as said foil a gold-arsenic foil in the production of emitter regions for NPN-silicon planar transistors.

6. A method as defined in claim 2, wherein said foils have a thickness of from 25 to 50 $\mu m$.

7. A method as defined in claim 2, wherein said foil is adjusted to the structure of said surface of said semiconductor body and is held on said surface in register.

8. A method as defined in claim 2, wherein the material for the insulating layer is selected from the group consisting of silicon oxide, silicon dioxide, and silicon nitride.

9. A method as defined in claim 1, further comprising controlling the cross section, intensity, interval rhythm and the displacement of said electron beam by means of a programmed computer.

10. A method of producing a transistor having a multiple-emitter structure comprising the steps of forming an insulating layer on a surface of a semiconductor body of a first type of conductivity and forming the collector region, forming a base window in said insulating layer, vapor depositing on said surface of said semiconductor body a layer of a substance containing the base diffusion material, diffusing in a heat treatment said base diffusion material from said vapor-deposited layer into said semiconductor body through said base window to form a base region in said semiconductor body, removing said deposited layer, forming recesses in said base region which extend short of the base to collector junction by means of an electron beam, masking said surface of said semiconductor body with an insulating layer so as to leave said recesses uncovered, placing a foil of an emitter-alloying material over that part of said masking insulating layer which lies over the base region and over said recesses, and alloying portions of said foil into said recesses by means of a controlled electron beam forming base-to-emitter barrier layers and leaving said foil which is not alloyed into said recesses to provide electrical connection between said recesses.

* * * * *